United States Patent
Zhou et al.

(10) Patent No.: US 12,266,851 B2
(45) Date of Patent: Apr. 1, 2025

(54) MANUFACTURING METHOD OF METAL MESH, THIN FILM SENSOR AND MANUFACTURING METHOD THEREOF

(71) Applicants: Beijing BOE Technology Development Co., Ltd., Beijing (CN); BOE TECHNOLOGY GROUP CO., LTD., Beijing (CN)

(72) Inventors: Jian Zhou, Beijing (CN); Feng Wang, Beijing (CN); Yuju Chen, Beijing (CN); Feng Qu, Beijing (CN)

(73) Assignees: Beijing BOE Technology Development Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/640,846

(22) PCT Filed: Apr. 23, 2021

(86) PCT No.: PCT/CN2021/089138
§ 371 (c)(1),
(2) Date: Mar. 7, 2022

(87) PCT Pub. No.: WO2022/222123
PCT Pub. Date: Oct. 27, 2022

(65) Prior Publication Data
US 2024/0047863 A1 Feb. 8, 2024

(51) Int. Cl.
*H01Q 1/38* (2006.01)
(52) U.S. Cl.
CPC ..................................... *H01Q 1/38* (2013.01)

(58) Field of Classification Search
CPC ...... H01Q 1/38; H01Q 1/1271; H01Q 9/0407; H01L 27/146
See application file for complete search history.

(56) References Cited

U.S. PATENT DOCUMENTS

2015/0289370 A1   10/2015  Gao et al.
2016/0278205 A1*   9/2016  Bae .......................... H05K 3/04
(Continued)

FOREIGN PATENT DOCUMENTS

CN   101207137 A   6/2008
CN   101261331 A   9/2008
(Continued)

OTHER PUBLICATIONS

China Patent Office, the first Office action dated Jan. 17, 2025, for corresponding CN application No. 202180000869.4.

*Primary Examiner* — Jonathan Han
(74) *Attorney, Agent, or Firm* — HOUTTEMAN LAW LLC

(57) ABSTRACT

The present disclosure provides a manufacturing method of a metal mesh, a thin film sensor and a manufacturing method of the thin film sensor, and belongs to the technical field of electronic devices. The manufacturing method of the metal mesh of the present disclosure includes: providing a base substrate; forming a pattern including a first epitaxial structure on the base substrate through a patterning process, wherein the first epitaxial structure has a first groove in a mesh shape; forming a first dielectric layer covering on a side of the first epitaxial structure away from the base substrate, so as to form a second groove in a mesh shape; and forming a metal material in the second groove on a side of the first dielectric layer away from the base substrate through a patterning process, so as to form a metal mesh.

19 Claims, 6 Drawing Sheets

(56) References Cited

U.S. PATENT DOCUMENTS

| | | | |
|---|---|---|---|
| 2017/0229496 A1* | 8/2017 | Velichko | H01L 27/14629 |
| 2017/0358620 A1 | 12/2017 | Chen et al. | |
| 2020/0251510 A1* | 8/2020 | Ge | H01L 27/14621 |

FOREIGN PATENT DOCUMENTS

| | | | |
|---|---|---|---|
| CN | 103413593 A | 11/2013 | |
| CN | 105759477 A | 7/2016 | |
| CN | 108231846 A | 6/2018 | |
| CN | 108598101 A | 9/2018 | |
| CN | 111697017 A | 9/2020 | |
| CN | 211507150 U | 9/2020 | |
| JP | 2005259478 A | 9/2005 | |

* cited by examiner

MANUFACTURING METHOD OF METAL MESH, THIN FILM SENSOR AND MANUFACTURING METHOD THEREOF

TECHNICAL FIELD

The present disclosure belongs to the technical field of electronic devices, and particularly relates to a method for manufacturing a metal mesh, a thin film sensor and a manufacturing method thereof.

BACKGROUND

At present, a line width of a micro-nano processing technology commonly used in a glass-based semiconductor industry is about 2 μm to 3 μm. Some thin film display and sensing devices, such as transparent microwave devices and the like, put higher requirements on the line width of micro-nano processing technology. For a transparent microwave device, a metal mesh is generally used as a transmitting or receiving unit for signals, which inevitably causes the light transmittance to be reduced, so how to further improve the light transmittance becomes the key point of the next research.

SUMMARY

The present disclosure aims to solve at least one technical problem in the prior art and provides a method for manufacturing a metal mesh, a thin film sensor and a manufacturing method thereof.

In a first aspect, embodiments of the present disclosure provide a method for manufacturing a metal mesh, including:

providing a base substrate;

forming a pattern including a first epitaxial structure on the base substrate through a patterning process, wherein the first epitaxial structure has a first groove in a mesh shape;

forming a first dielectric layer on a side of the first epitaxial structure away from the base substrate, so as to form a second groove in a mesh shape; and forming a metal material in the second groove on a side of the first dielectric layer away from the base substrate through a patterning process, so as to form a metal mesh.

The step of forming a pattern including a first epitaxial structure on the base substrate through a patterning process includes steps of:

depositing a second dielectric material layer on the base substrate, and curing the deposited second dielectric material layer;

forming a third dielectric material layer on a side of the second dielectric material layer away from the base substrate, and forming a third dielectric layer with a first hollow out pattern through a patterning process;

etching the second dielectric material layer by using the third dielectric layer as a mask, to form a second dielectric layer with a second hollow out pattern; and removing the third dielectric layer, wherein the second dielectric layer is used as the first epitaxial structure; the second hollow out pattern is used as the second groove.

A difference between refractive indexes of the first dielectric layer and the second dielectric layer is no greater than 1% of the refractive index of the first dielectric layer or the second dielectric layer.

The step of forming a pattern including a first epitaxial structure on the base substrate through a patterning process includes steps of:

depositing a second dielectric material layer on the base substrate;

forming a third dielectric material layer on a side of the second dielectric material layer away from the base substrate, and forming a third dielectric layer with a first hollow out pattern through a patterning process; and etching the second dielectric material layer by using the third dielectric layer as a mask, to form a second dielectric layer with a second hollow out pattern, wherein the first hollow out pattern and the second hollow out pattern are arranged in a laminated manner to form the first groove; and the second dielectric layer and the third dielectric layer are used as the first epitaxial structure.

A difference between refractive indexes of any two of the first dielectric layer, the second dielectric layer, and the third dielectric layer is not greater than 1% of the refractive index of the first dielectric layer, the second dielectric layer, or the third dielectric layer.

The second dielectric layer is made of an organic material; the third dielectric layer is made of an inorganic material.

The material of the first dielectric layer and the material of the third dielectric layer are the same.

The step of forming the metal material in the second groove through a patterning process to form the metal mesh includes steps of:

sequentially depositing a metal film and a photoresist on the side of the first dielectric layer away from the base substrate by using an electron beam evaporation apparatus and forming the metal material in the second groove through exposure, development and etching to form the metal mesh.

The step of forming the metal material in the second groove through a patterning process to form the metal mesh includes steps of:

forming a metal film serving as a seed layer on a side of the first dielectric layer away from the base substrate;

electroplating the seed layer to form the metal material in the second groove and on a side of the first dielectric layer away from the base substrate; and removing at least the metal material outside the second groove to form the metal mesh with the metal material in the second groove.

In a second aspect, embodiments of the present disclosure provide a method for manufacturing a thin film sensor including the above method for manufacturing a metal mesh.

In a third aspect, embodiments of the present disclosure provide a thin film sensor, including:

a base substrate, a first epitaxial structure on the base substrate, with a first groove in a mesh shape;

a first dielectric layer covering a side of the first epitaxial structure layer away from the base substrate, so as to form a second groove in a mesh shape; and a metal mesh on a side of the first dielectric layer away from the base substrate, wherein an orthographic projection of the metal mesh on the base substrate is within an orthographic projection of the second groove on the base substrate.

A material of the first epitaxial structure is an organic material and a material of the first dielectric layer is an inorganic material.

A difference between refractive indexes of the first epitaxial structure and the first dielectric layer is no greater than 1% of the refractive index of the first epitaxial structure or the first dielectric layer.

The first epitaxial structure includes a second dielectric layer and a third dielectric layer in sequence on a side away from the base substrate; the second dielectric layer includes a second hollow out pattern in a mesh shape, and the third dielectric layer includes a first hollow out pattern in a mesh shape; the second hollow out pattern and the first hollow out pattern are connected to each other to form the first groove.

A difference between refractive indexes of any two of the first dielectric layer, the second dielectric layer, and the third dielectric layer is not greater than 1% of the refractive index of the first dielectric layer, the second dielectric layer, or the third dielectric layer.

The first dielectric layer and the third dielectric layer are made of a same material.

DETAIL DESCRIPTION OF EMBODIMENTS

In order to enable one of ordinary skill in the art to better understand the technical solutions of the embodiments of the present disclosure, the present invention will be described in further detail with reference to the accompanying drawings and the detailed description.

Unless defined otherwise, technical or scientific terms used herein shall have the ordinary meaning as understood by one of ordinary skill in the art to which the present disclosure belongs. The terms "first", "second", and the like used in the present disclosure are not intended to indicate any order, quantity, or importance, but rather are used for distinguishing one element from another. Further, the term "a", "an", "the", or the like used herein does not denote a limitation of quantity, but rather denotes the presence of at least one element. The term of "comprising", "including", or the like, means that the element or item preceding the term contains the element or item listed after the term and its equivalent, but does not exclude other elements or items. The term "connected", "coupled", or the like is not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly.

Figure 1:
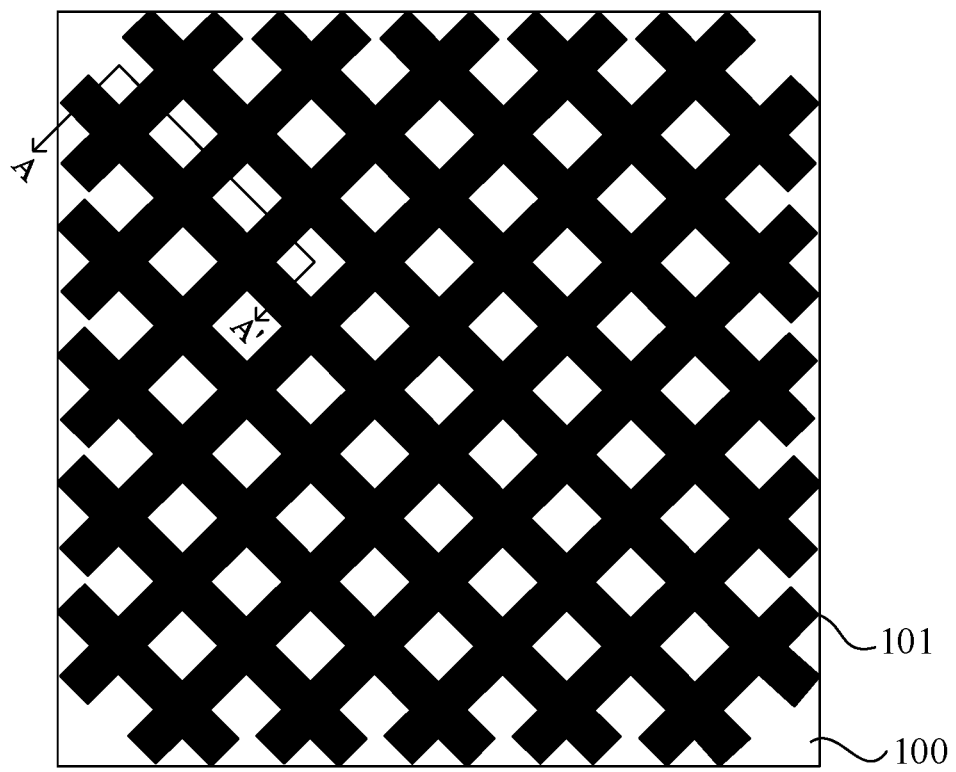
FIG. 1 is a schematic diagram of a structure of an exemplary thin film sensor.
Figure 2:
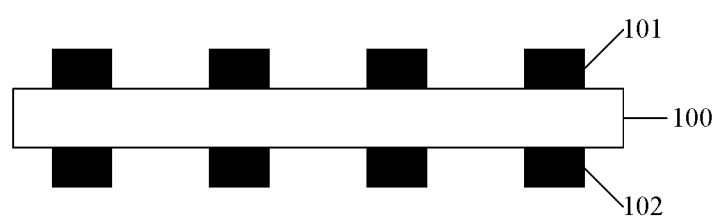
FIG. 2 is a schematic cross-sectional view of a structure of the film sensor shown in FIG. 1 along a direction A-A'.

FIG. 1 is a schematic diagram of a structure of an exemplary thin film sensor. FIG. 2 is a schematic cross-sectional view of a structure of the thin film sensor shown in FIG. 1 along a direction A-A'. As shown in FIGS. 1 and 2, a thin film sensor includes a base substrate 100 having a first surface and a second surface, i.e. an upper surface and a lower surface, opposite to each other; a first conductive layer 101 and a second conductive layer 102 are respectively located on the first surface and the second surface of the base substrate 100. As an example, the thin film sensor acts as a transparent antenna, the first conductive layer 101 may be a radiation layer, and the second conductive layer 102 may be a ground layer. The radiation layer may be used as a receiving unit of the antenna structure or may also be used as a transmitting unit of the antenna structure.

In order to ensure that the first conductive layer 101 and the second conductive layer 102 have good light transmittance, the first conductive layer 101 and the second conductive layer 102 need to be patterned. For example, the first conductive layer 101 may be formed by mesh lines made of a metal material, and the second conductive layer 102 may also be formed by mesh lines made of a metal material. It is understood that the first conductive layer 101 and the second conductive layer 102 may also be formed by other structures having patterns, for example, block electrodes having patterns, such as diamond-shaped, triangular, etc. which are not listed here. As may be seen from FIG. 1, the first conductive layer 101 and the second conductive layer 102, i.e., the mesh lines, are provided on both surfaces, but not on the whole surface, of the base substrate 100. Any mesh line is formed by metal grids electrically connected to each other. Due to the material and the forming process of the metal grids, a line width of the metal grid is wider, so that the light transmittance of the thin film sensor is seriously influenced, and the use experience of a user is influenced.

It should be noted that the metal mesh is not limited to be applied in the antenna structure, and may also be applied in a touch panel as a touch electrode. Alternatively, the metal mesh may also be used in various metal wires, which are not listed here.

In order to solve the above technical problem, a method for manufacturing a metal mesh is provided in the embodiments of the present disclosure. In the embodiments of the present disclosure, as an example, the metal mesh is only applied to the antenna as a receiving unit and/or a transmitting unit of the antenna, but it should be understood that this does not limit the scope of the embodiments of the present disclosure.

Figure 3:
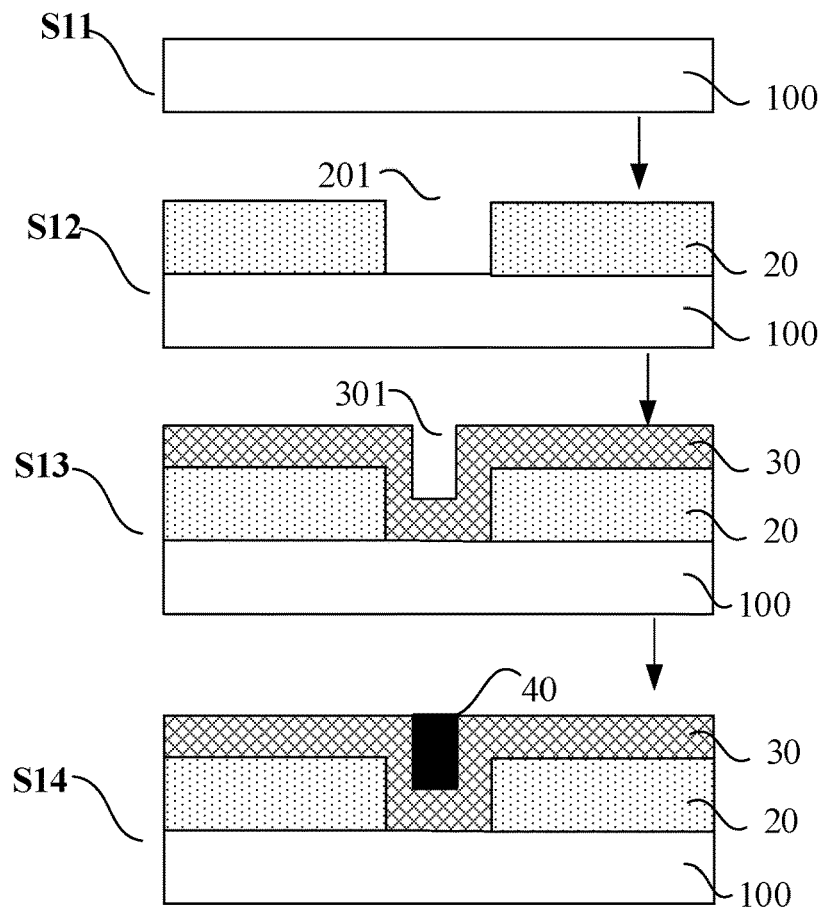
FIG. 3 is a flowchart of a method for manufacturing a metal mesh according to an embodiment of the present disclosure.

In a first aspect, FIG. 3 is a flowchart of a method for manufacturing a metal mesh 40 according to an embodiment of the present disclosure; referring to FIG. 3, an embodiment of the present disclosure provides a method for manufacturing a metal mesh 40, which includes steps of:

S11, providing abase substrate 100.

In some examples, the base substrate 100 may be a flexible film, and the flexible film may be made of at least one of a COP film, a Polyimide (PI), or a polyethylene terephthalate (PET). In this case, in S1, the flexible COP film may be attached to a glass substrate through a transparent optical adhesive (OCA adhesive), and then the glass substrate, on which the COP film is formed, is cleaned.

Figure 4:
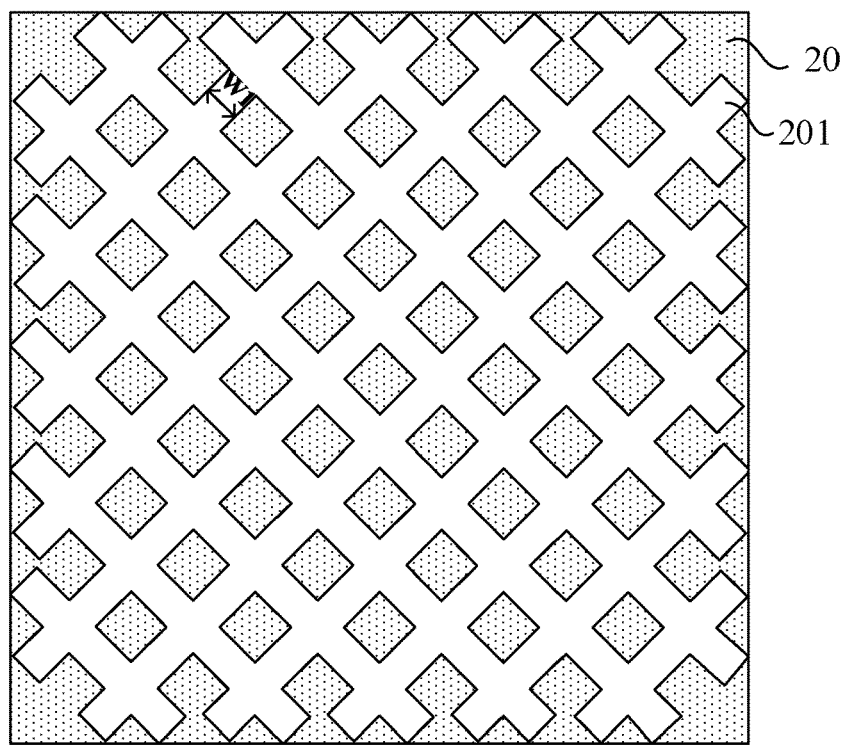
FIG. 4 is a top view of an intermediate product formed in a step S12 of the method for manufacturing a metal mesh according to an embodiment of the present disclosure.

S12, forming a pattern including a first epitaxial structure having a first groove 201 in a mesh shape on the base substrate 100 through a patterning process. In the embodiment of the present disclosure, a width of the first groove 201 is a first width W1, as shown in FIG. 4.

The first groove 201 may be a slotted structure penetrating the first epitaxial structure in a thickness direction of the first epitaxial structure, or may be a blind groove penetrating through a certain thickness of the first epitaxial structure in the thickness direction of the first epitaxial structure. As an example, the first groove 201 is the slotted structure shown in FIG. 4 in the embodiment of the present disclosure.

Figure 5:
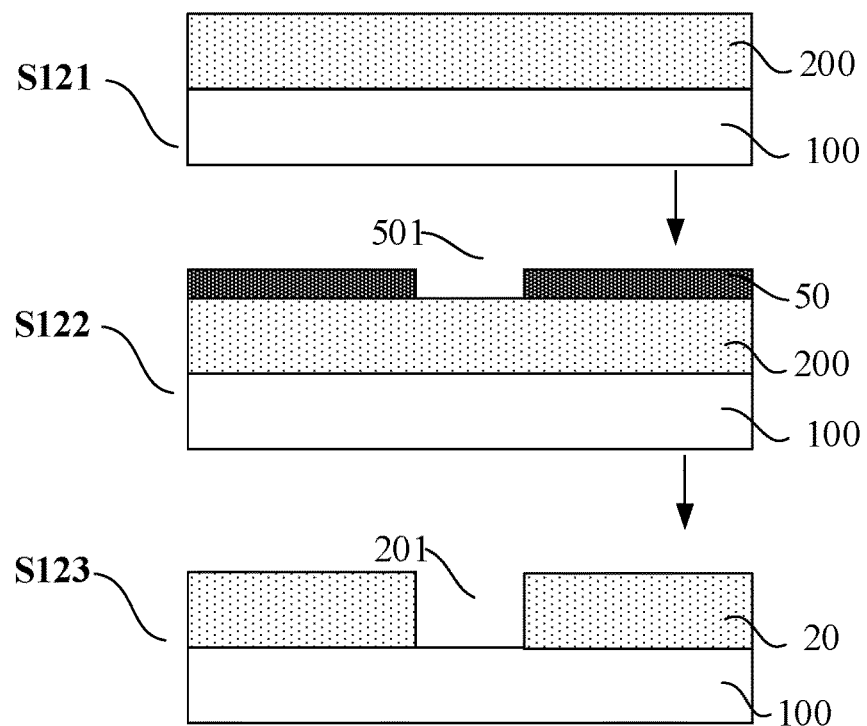
FIG. 5 is a flowchart illustrating the step S12 of the method for manufacturing a metal mesh according to an embodiment of the present disclosure.

In some examples, referring to FIG. 5, step S12 may include steps of:

S121, depositing a second dielectric material layer 200 on the base substrate 100.

In some examples, a material of the second dielectric material layer 200 includes, but is not limited to, organic materials, such as resin materials including polyimide, epoxy, acryl, polyester, photoresist, polyacrylate, polyamide, siloxane, and the like. The organic material is used as the material of the second dielectric material layer, so that a sidewall of the first groove 201 formed in the subsequent process is perpendicular to a surface of the base substrate 100, which results in the uniform line width of the metal mesh 40 formed subsequently.

In some examples, the step S121 may specifically include forming a second dielectric material with a thickness of about 4 μm or more on the base substrate 100 by a method including, but not limited to, spin coating, and curing the formed second dielectric material, for example, by baking and UV (ultraviolet) exposure. A curing temperature is from 110° C. to 150° C., specifically, 130° C.

S122, forming a pattern including a third dielectric layer 50 on a side of the second dielectric material layer 200 away from the base substrate 100 through a patterning process; the third dielectric layer 50 has a first hollow out pattern 501 in a mesh shape penetrating the third dielectric layer 50 along a thickness direction of the third dielectric layer 50.

In some examples, a material of the third dielectric layer 50 includes, but is not limited to, an inorganic material, a metal oxide, a metal material, and the like. Inorganic materials are such as silicon nitride (SiNx), silicon oxide ($SiO_2$), silicon oxynitride (SiON), and the like; metal materials are such as copper (Cu), aluminum (Al), molybdenum (Mo), silver (Ag); metal oxides are such as Indium Tin Oxide (ITO) and the like. In the embodiment of the present disclosure, as an example, the material of the third dielectric layer 50 is an inorganic material. In some examples, step S122 may include successively depositing the third dielectric material layer 500 and a photoresist on a side of the second dielectric material layer 200 away from the base substrate 100, then performing the exposure and the development, then performing the etching, and finally, stripping the photoresist to form the pattern of the third dielectric layer 50 including the first hollow out pattern 501 in a mesh shape.

S123, etching the second dielectric material layer 200 by using the third dielectric layer 50 as a mask, to form a second dielectric layer 20 with a second hollow out pattern, and to remove the third dielectric layer 50. That is, the first epitaxial structure is formed, and the second hollow out pattern is used as the first groove 201.

In some examples, the step S123 may specifically include removing the material of the second dielectric material layer 200 at a position of the first hollow out pattern 501 in a dry etching method by using the third dielectric layer 50 as the mask, to form the second dielectric layer 20 with the second hollow out pattern. That is, the first epitaxial structure is formed.

Figure 6:
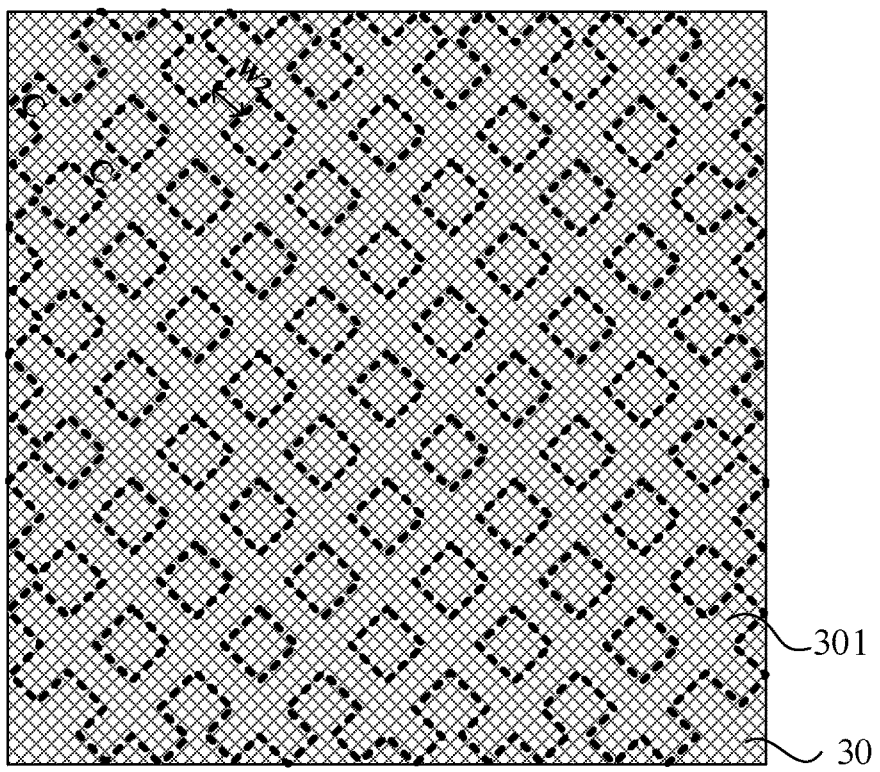
FIG. 6 is a top view of an intermediate product formed in a step S13 of the method for manufacturing a metal mesh according to an embodiment of the present disclosure.

S13, forming the first dielectric layer 30 on a side of the second dielectric layer 20 away from the base substrate 100. The first dielectric layer 30 covers the sidewall of the first groove 201 to form a second groove 301, as shown in FIG. 6.

It should be noted that the second groove 301 is actually a blind groove structure defined by the first dielectric layer 30 deposited on the sidewall of the first groove 201, that is, the second groove 301 is formed, where a width of the second groove 301 is a second width W2, obviously, W2<W1, and the width W2 of the second blind groove is determined by a thickness of the formed first dielectric layer 30.

In some examples, the first dielectric layer 30 having a certain thickness is deposited such that a groove width of the first groove 201 is reduced from 3 μm to 4 μm to less than 2.0 μm, i.e., the width W2 of the second groove 301 formed by the first dielectric layer 30 is not greater than 1.5 μm. In some examples, the first dielectric layer 30 may be a single layer structure of a silicon oxide film or a silicon nitride film, or a composite film structure of a silicon oxide film and a silicon nitride film.

In some examples, the refractive indexes of the first dielectric layer 30 and the second dielectric layer 20 are the same, or a difference therebetween is less than 1%, even less than 0.5%. That is, the refractive indexes of the first dielectric layer 30 and the second dielectric layer 20 are substantially the same in the embodiments of the present disclosure, so that the problem of dispersion due to light irradiated onto the first dielectric layer 30 and the second dielectric layer 20 may be avoided.

Figure 7:
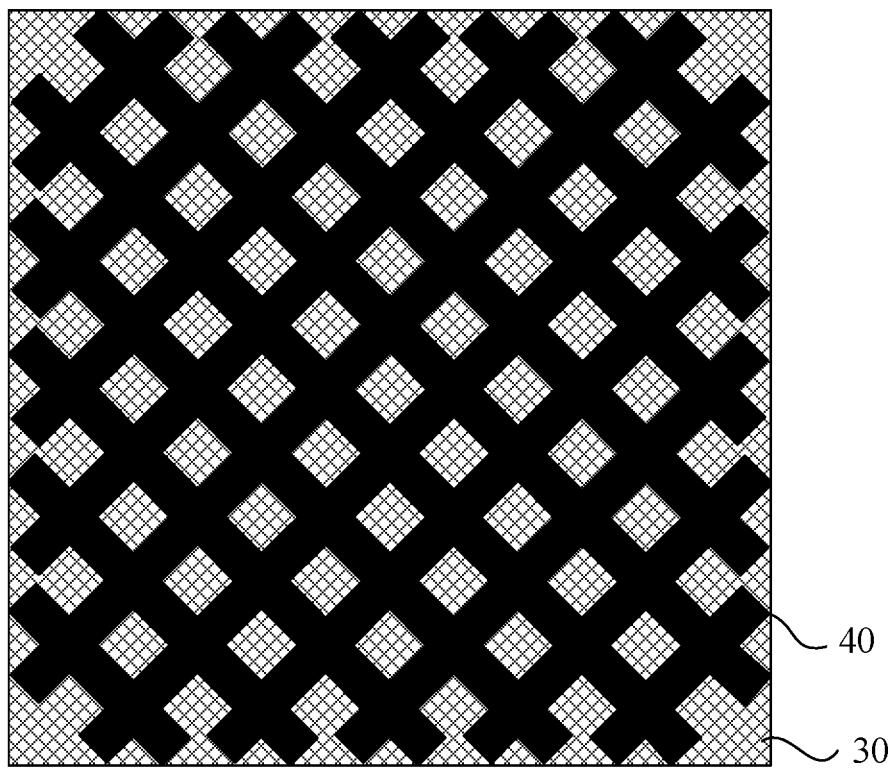
FIG. 7 is a top view of a metal mesh formed in a step S14 of the method for manufacturing a metal mesh according to the embodiment of the present disclosure.
Figure 8:
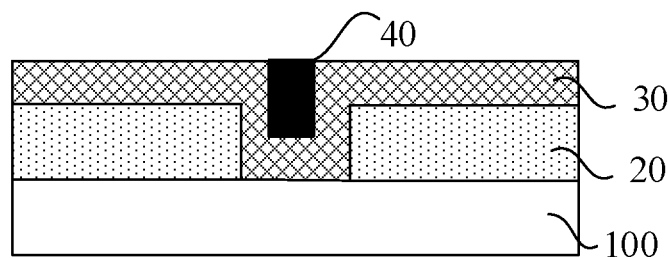
FIG. 8 is a cross-sectional view of a metal mesh formed in a step S14 of the method for manufacturing a metal mesh according to the embodiment of the present disclosure.

S14, forming a metal material in the second groove 301 and on a side of the first dielectric layer 30 away from the base substrate through a patterning process to form the metal mesh 40, as shown in FIGS. 7 and 8.

In some examples, the metal material includes, but is not limited to, one or more of copper, titanium, aluminum, silver. A line width of the metal mesh 40 formed in the embodiment of the present disclosure may be 1.5 μm or less, wherein the line width of the metal mesh 40 refers to a width of a metal line formed of a metal material formed in the second groove 301, and the width of the metal line is equal to or substantially equal to the groove width of the second groove 301.

In some examples, step S14 may include evaporating a metal film on the side of the first dielectric layer 30 away from the base substrate 100 by using an electron beam evaporation apparatus, where the metal film has a height difference because the second groove 301 is formed in the first dielectric layer 30; and then, spin-coating photoresist on a side of the metal film away from the base substrate 100, then performing exposure and development, then performing etching, and finally, stripping the photoresist, to form the metal material in the first groove 201 so as to form the metal mesh 40.

In some examples, step S14 may further include steps of:

S141, sequentially depositing a titanium film and a copper film on the side of the first dielectric layer 30 away from the base substrate 100 by a process, including but not being limited to, a sputtering process, to form the metal film.

It should be noted that only one layer of the copper film may be deposited in this step, and the titanium film is used to increase the adhesion of the copper film.

S142, electroplating the metal film as a seed layer.

In some examples, step 142 specifically includes: placing the side of the base substrate 100 having the first dielectric layer 30 on a carrier of an electroplating machine; pressing (mounting) power-on pads on the base substrate 100; placing the base substrate in a hole-filling electroplating bath (using a dedicated hole-filling electrolyte in the bath); applying a current across the power-on pads, wherein the electroplating solution keeps flowing continuously and rapidly on a surface of the base substrate 100; and cations in the electroplating solution obtain electrons on a sidewall of the second groove 301, to form atoms which are in turn deposited on the sidewall; by using the dedicated hole-filling electrolyte with a specific proportion, a deposition rate of metal copper mainly in the second groove 301 may be achieved at a high speed (deposition rate of 0.5 to 3 µm/min), while the deposition rate of metal copper on the second dielectric layer 20 is very small (0.005 to 0.05 µm/min). As time increases, the metal copper on the sidewall of the second groove 301 gradually grows thicker, and even the second groove 301 may be completely filled, and finally, the base substrate 100 is taken out from the hole-filling electroplating bath and cleaned by using the deionized water.

S143, removing the metal material outside the second groove 301 by using a copper etching solution, thereby forming the metal mesh 40.

Alternatively, dry etching may be used to remove the metal material outside the second groove 301 in step S413.

The manufacturing of the metal mesh 40 is completed.

According to the manufacturing method of the metal mesh 40 provided by the embodiment of the present disclosure, the first dielectric layer 30 is deposited on the sidewall of the first groove 201 to reduce the width of the first groove 201, that is, to form the second groove 301 (the width of the groove is changed from the first width W1 to the second width W2, W2 is less than W1); and then the metal material is formed in the second groove 301, so that the line width of the formed metal mesh 40 is small, which improves the light transmittance of a product when the metal mesh 40 is applied to the thin film sensor.

Figure 9:
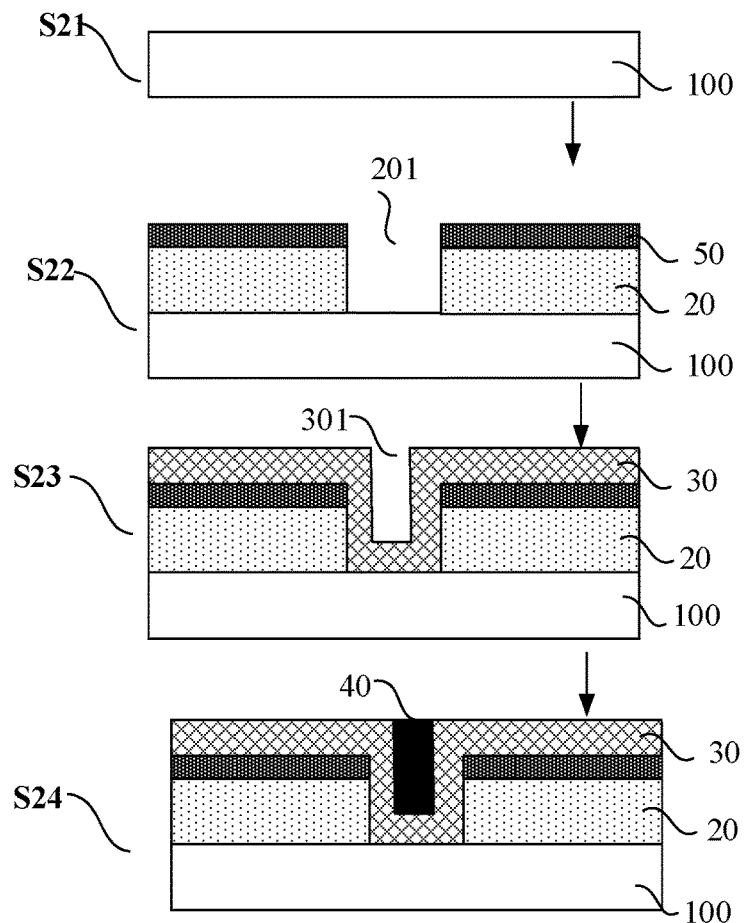
FIG. 9 is a flowchart of a method for manufacturing a metal mesh according to an embodiment of the present disclosure.
Figure 10:
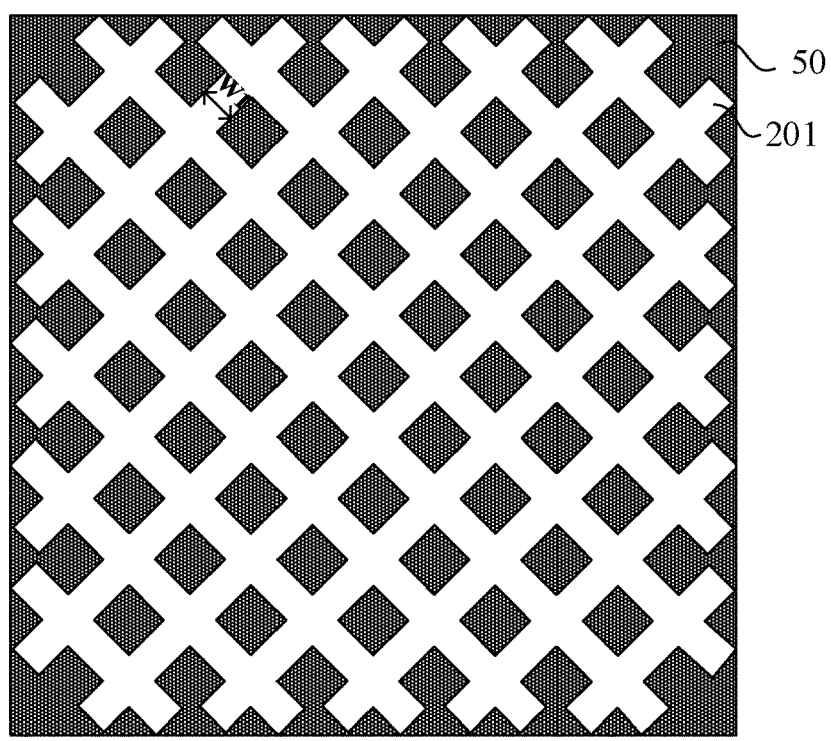
FIG. 10 is a top view of an intermediate product formed in a step S22 of the method for manufacturing a metal mesh according to an embodiment of the present disclosure.

FIG. 9 is a flowchart of another method for manufacturing a metal mesh 40 according to an embodiment of the present disclosure. Referring to FIG. 9, an embodiment of the present disclosure further provides a method for manufacturing a metal mesh 40, specifically including steps of:

S21, providing a base substrate 100.

In some examples, the base substrate 100 may be a flexible film, and the flexible film may be made of at least one of a COP film, a Polyimide (PI), or a polyethylene terephthalate (PET). In this case, in S1, the flexible COP film may be attached to a glass substrate through a transparent optical adhesive (OCA adhesive), and then the glass substrate, on which the COP film is formed, is cleaned.

S22, forming a pattern including a first epitaxial structure having a first groove 201 in a mesh shape on the base substrate 100 through a patterning process. In the embodiment of the present disclosure, a width of the first groove 201 is a first width W1.

Figure 11:
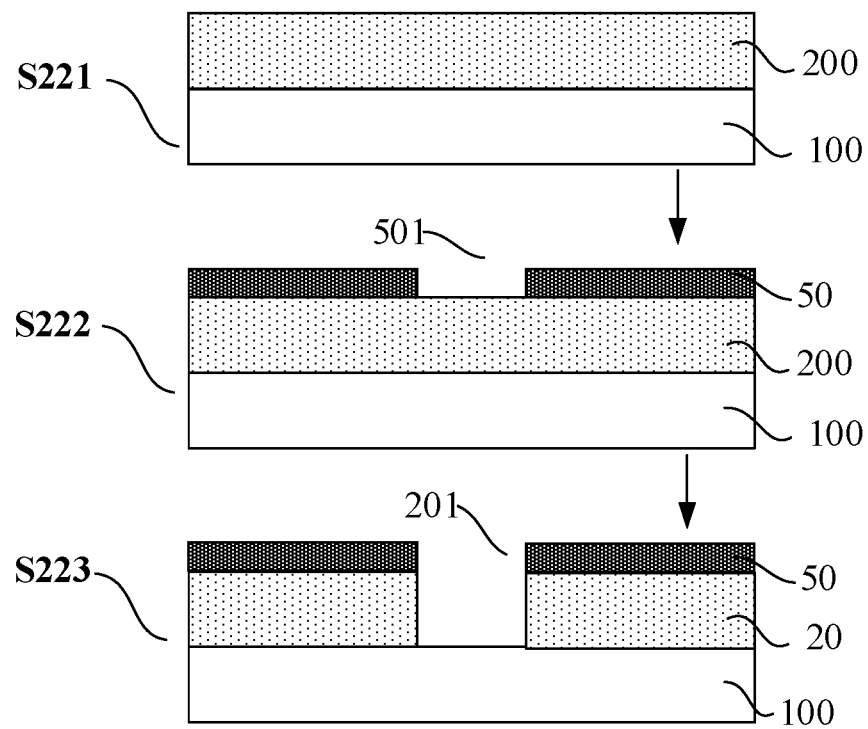
FIG. 11 is a flowchart illustrating the step S22 of the method for manufacturing a metal mesh according to an embodiment of the present disclosure.

In some examples, referring to FIG. 11, step S22 may include steps of:

S221, depositing a second dielectric material layer 200 on the base substrate 100.

The material and the forming process of the second dielectric material layer 200 may be the same as those in step S121, and therefore are not described herein again.

S222, forming a pattern including a third dielectric layer 50 on a side of the second dielectric material layer 200 away from the base substrate 100 through a patterning process; the third dielectric layer 50 has a first hollow out pattern 501 in a mesh shape penetrating the third dielectric layer 50 along a thickness direction of the third dielectric layer 50.

The material and the forming process of the third dielectric layer 50 may be the same as those in step S122, and therefore are not described herein again.

S223, etching the second dielectric material layer 200 by using the third dielectric layer 50 as a mask, to form a second dielectric layer 20 with a second hollow out pattern, wherein the first hollow out pattern 501 and the second hollow out pattern are connected to each other. That is, the first groove 201 is formed. That is, the second dielectric layer 20 and the third dielectric layer 50 are stacked as the first epitaxial structure.

In some examples, the step S223 may specifically include removing the material of the second dielectric material layer 200 at a position of the first hollow out pattern 501 in a dry etching method by using the third dielectric layer 50 as the mask, to form the second dielectric layer 20 with the second hollow out pattern. That is, the first epitaxial structure is formed.

The materials of the second dielectric layer 20 and the third dielectric layer 50 may be the same as those in the above manufacturing method, and therefore, are not described herein again.

S23, forming the first dielectric layer 30 on a side of the third dielectric layer 50 away from the base substrate 100, where the first dielectric layer 30 covers the sidewall of the first groove 201 to form the second groove 301.

It should be noted that the second groove 301 is actually a blind groove structure defined by the first dielectric layer 30 deposited on the sidewall of the first groove 201, that is, the second groove 301 is formed, where a width of the second groove 301 is a second width W2, obviously, W2<W1, and the width W2 of the second blind groove is determined by a thickness of the formed first dielectric layer 30.

In some examples, the first dielectric layer 30 having a certain thickness is deposited such that a groove width of the first groove 201 is reduced from 3 µm to 4 µm to less than 2.0 µm, i.e., the width W2 of the second groove 301 formed by the first dielectric layer 30 is not greater than 1.5 µm. In some examples, the first dielectric layer 30 may be a single layer structure of a silicon oxide film or a silicon nitride film, or a composite film structure of a silicon oxide film and a silicon nitride film.

In some examples, the refractive indexes of any two of the first dielectric layer 30, the second dielectric layer 20 and the third dielectric layer 50 are the same, or a difference therebetween is less than 1%, even less than 0.5%. That is, the refractive indexes of the first dielectric layer 30, the second dielectric layer 20 and the third dielectric layer 50 are substantially the same in the embodiments of the present disclosure, so that the problem of dispersion due to light irradiated onto the first dielectric layer and the second dielectric layer 20 may be avoided. Preferably, the third dielectric layer 50 and the first dielectric layer 30 in the embodiment of the present disclosure are made of the same material, that is, a single-layer structure of a silicon oxide film or a silicon nitride film, or a composite film structure of a silicon oxide film and a silicon nitride film.

Figure 12:
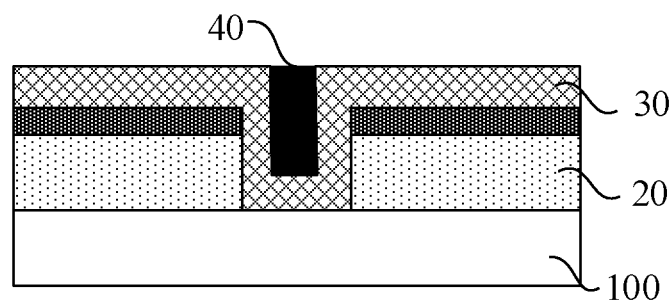
FIG. 12 is a cross-sectional view of a metal mesh formed in a step S24 of the method for manufacturing a metal mesh according to the embodiment of the present disclosure.

S24, forming a metal material in the second groove 301 and on a side of the first dielectric layer 30 away from the base substrate through a patterning process to form the metal mesh 40, as shown in FIG. 12.

The step S24 may use the same process as the step S14, and thus is not described herein again.

According to the manufacturing method of the metal mesh 40 provided by the embodiment of the present disclosure, the first dielectric layer 30 is deposited on the sidewall of the first groove 201 to reduce the width of the first groove 201, that is, to form the second groove 301 (the width of the groove is changed from the first width W1 to the second width W2, W2 is less than W1); and then the metal material is formed in the second groove 301, so that the line width of the formed metal mesh 40 is small, which improves the light transmittance of a product when the metal mesh 40 is applied to the thin film sensor. In addition, in the embodiment of the present disclosure, the refractive indexes of the first dielectric layer 30, the second dielectric layer 20 and the third dielectric layer 50 are substantially the same, so that the problem of dispersion due to light irradiated onto the first dielectric layer and the second dielectric layer 20 may be avoided.

In a second aspect, the embodiments of the present disclosure also provide a method for manufacturing a thin film sensor including, but not limited to, a transparent antenna; the method may include the above-mentioned method for manufacturing the metal mesh 40.

The manufacturing method of the thin film sensor in the embodiment of the present disclosure includes the manufacturing method of the metal mesh 40, so that the transmittance of the thin film sensor formed by the method is high, and the influence on the optical effect of a display device with the thin film sensor is obviously reduced.

In a third aspect, embodiments of the present disclosure provide a thin film sensor, which may be manufactured using the above method. The thin film sensor includes, but not limited to, a transparent antenna. The metal mesh 40 in the thin film sensor in the embodiment of the present disclosure is manufactured by the above method, so the line width of the metal mesh 40 is narrow, for example, not greater than 2 even below 1.5 μm.

Referring to FIG. 8, the thin film sensor in an embodiment of the present disclosure includes: a base substrate 100, a first epitaxial structure, a first dielectric layer 30 and a metal mesh 40, wherein the first epitaxial structure is arranged on the base substrate 100, and the first epitaxial structure is provided with a first groove 201 in a mesh shape; the first dielectric layer 30 covers a side of the first epitaxial structure away from the base substrate 100, so as to form a second groove 301 in a mesh shape; the metal mesh 40 is arranged on a side of the first dielectric layer 30 away from the base substrate 100, and an orthographic projection of the metal mesh 40 on the base substrate 100 is positioned in an orthographic projection of the second groove on the base substrate.

In some examples, the material of the first epitaxial structure is an organic material and the material of the first dielectric layer 30 is an inorganic material. For example, the first epitaxial structure may be a film formed of resin materials including polyimide, epoxy, acryl, polyester, photoresist, polyacrylate, polyamide, siloxane, and the like. The first dielectric layer 30 may be a single layer structure of a silicon oxide film or a silicon nitride film, or a composite film structure of a silicon oxide film and a silicon nitride film.

In some examples, the refractive indexes of the first dielectric layer 30 and the second dielectric layer 20 are the same, or a difference therebetween is less than 1%, even less than That is, the refractive indexes of the first dielectric layer 30 and the second dielectric layer 20 are substantially the same in the embodiments of the present disclosure, so that the problem of dispersion due to light irradiated onto the first dielectric layer and the second dielectric layer 20 may be avoided.

Referring to FIG. 12, the thin film sensor has substantially the same structure as the thin film sensor shown in FIG. 8, except that the first epitaxial structure includes the second dielectric layer 20 and the third dielectric layer 50 sequentially disposed on a side away from the base substrate 100; the second dielectric layer 20 has the second hollow out pattern in a mesh shape, and the third dielectric layer 50 has the first hollow out pattern 501 in a mesh shape; the second hollow out pattern and the first hollow out pattern 501 are connected to each other to form the first groove 201.

In some examples, the refractive indexes of any two of the first dielectric layer 30, the second dielectric layer 20 and the third dielectric layer 50 are the same, or a difference therebetween is less than 1%, even less than 0.5%. That is, the refractive indexes of the first dielectric layer 30, the second dielectric layer 20 and the third dielectric layer 50 are substantially the same in the embodiments of the present disclosure, so that the problem of dispersion due to light irradiated onto the first dielectric layer and the second dielectric layer 20 may be avoided. Preferably, the third dielectric layer 50 and the first dielectric layer 30 in the embodiment of the present disclosure are made of the same material, that is, a single-layer structure of a silicon oxide film or a silicon nitride film, or a composite film structure of a silicon oxide film and a silicon nitride film.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A method for manufacturing a metal mesh, comprising:
providing a base substrate;
forming a pattern comprising a first epitaxial structure on the base substrate through a patterning process such that the first epitaxial structure has a first groove in a mesh shape;
forming a first dielectric layer on a side of the first epitaxial structure away from the base substrate, to form a second groove in a mesh shape; and
forming a metal material in the second groove on a side of the first dielectric layer away from the base substrate through a patterning process, to form the metal mesh,
wherein the forming a pattern comprising a first epitaxial structure on the base substrate through a patterning process comprises:

depositing a second dielectric material layer on the base substrate, and then curing the second dielectric material layer deposited on the base substrate;

forming a third dielectric material layer on a side of the second dielectric material layer away from the base substrate, and forming a third dielectric layer with a first hollow out pattern through a patterning process;

etching the second dielectric material layer with the third dielectric layer as a mask, to form a second dielectric layer with a second hollow out pattern; and removing the third dielectric layer such that the second dielectric layer is used as the first epitaxial structure and the second hollow out pattern is used as the second groove.

2. The method of claim 1, wherein a difference between refractive indexes of the first dielectric layer and the second dielectric layer is no greater than 1% of the refractive index of the first dielectric layer or the second dielectric layer.

3. The method of claim 1, wherein a material of the second dielectric layer comprises an organic material, and a material of the third dielectric layer comprises an inorganic material.

4. The method of claim 1, wherein a material of the first dielectric layer is the same as a material of the third dielectric layer.

5. The method of claim 1, wherein the forming a metal material in the second groove through a patterning process to form the metal mesh comprises:

sequentially depositing a metal film and a photoresist on the side of the first dielectric layer away from the base substrate by an electron beam evaporation apparatus and forming the metal material in the second groove through exposure, development and etching to form the metal mesh.

6. The method of claim 1, wherein the forming a metal material in the second groove through a patterning process to form the metal mesh comprises:

forming a metal film as a seed layer on a side of the first dielectric layer away from the base substrate;

electroplating the seed layer to form the metal material in the second groove and on a side of the first dielectric layer away from the base substrate; and removing at least the metal material outside the second groove to form the metal mesh with the metal material in the second groove.

7. A method for manufacturing a thin film sensor, comprising the method for manufacturing a metal mesh of claim 1.

8. The method of claim 2, wherein a material of the second dielectric layer comprises an organic material, and a material of the third dielectric layer comprises an inorganic material.

9. The method of claim 2, wherein a material of the first dielectric layer is the same as a material of the third dielectric layer.

10. A method for manufacturing a metal mesh, comprising:

providing a base substrate;

forming a pattern comprising a first epitaxial structure on the base substrate through a patterning process such that the first epitaxial structure has a first groove in a mesh shape;

forming a first dielectric layer on a side of the first epitaxial structure away from the base substrate, to form a second groove in a mesh shape; and forming a metal material in the second groove on a side of the first dielectric layer away from the base substrate through a patterning process, to form the metal mesh, wherein the forming a pattern comprising a first epitaxial structure on the base substrate through a patterning process comprises:

depositing a second dielectric material layer on the base substrate;

forming a third dielectric material layer on a side of the second dielectric material layer away from the base substrate, and forming a third dielectric layer with a first hollow out pattern through a patterning process; and etching the second dielectric material layer with the third dielectric layer as a mask, to form a second dielectric layer with a second hollow out pattern such that the first hollow out pattern and the second hollow out pattern are stacked to form the first groove and the second dielectric layer and the third dielectric layer are used as the first epitaxial structure.

11. The method of claim 10, wherein a difference between refractive indexes of any two of the first dielectric layer, the second dielectric layer, and the third dielectric layer is not greater than 1% of the refractive index of the first dielectric layer, the second dielectric layer, or the third dielectric layer.

12. The method of claim 10, wherein the forming a metal material in the second groove through a patterning process to form the metal mesh comprises:

sequentially depositing a metal film and a photoresist on the side of the first dielectric layer away from the base substrate by an electron beam evaporation apparatus and forming the metal material in the second groove through exposure, development and etching to form the metal mesh.

13. The method of claim 10, wherein the forming a metal material in the second groove through a patterning process to form the metal mesh comprises:

forming a metal film as a seed layer on a side of the first dielectric layer away from the base substrate;

electroplating the seed layer to form the metal material in the second groove and on a side of the first dielectric layer away from the base substrate; and removing at least the metal material outside the second groove to form the metal mesh with the metal material in the second groove.

14. A method for manufacturing a thin film sensor, comprising the method for manufacturing a metal mesh of claim 10.

15. A thin film sensor, comprising:

a base substrate, a first epitaxial structure with a first groove in a mesh shape on the base substrate;

a first dielectric layer on a side of the first epitaxial structure away from the base substrate, to form a second groove in a mesh shape; and a metal mesh on a side of the first dielectric layer away from the base substrate, wherein an orthographic projection of the metal mesh on the base substrate is within an orthographic projection of the second groove on the base substrate, wherein the first epitaxial structure comprises a second dielectric layer and a third dielectric layer arranged sequentially on a side away from the base substrate; the second dielectric layer comprises a second hollow out pattern in a mesh shape, and the third dielectric layer comprises a first hollow out pattern in a mesh shape; the second hollow out pattern and the first hollow out pattern communicate with each other to form the first groove.

16. The thin film sensor of claim 15, wherein a material of the first epitaxial structure is an organic material and a material of the first dielectric layer is an inorganic material.

17. The thin film sensor of claim 15, wherein a difference between refractive indexes of the first epitaxial structure and the first dielectric layer is no greater than 1% of the refractive index of the first epitaxial structure or the first dielectric layer.

18. The thin film sensor of claim 15, wherein a difference between refractive indexes of any two of the first dielectric layer, the second dielectric layer, and the third dielectric layer is not greater than 1% of the refractive index of the first dielectric layer, the second dielectric layer, or the third dielectric layer.

19. The thin film sensor of claim 15, wherein a material of the first dielectric layer is the same as a material of the third dielectric layer.

* * * * *